(12) United States Patent
Chang

(10) Patent No.: US 7,362,135 B1
(45) Date of Patent: Apr. 22, 2008

(54) APPARATUS AND METHOD FOR CLOCK SKEW ADJUSTMENT IN A PROGRAMMABLE LOGIC FABRIC

(76) Inventor: Hyun-Taek Chang, 40329 Loro Pl., Fremont, CA (US) 94539

( * ) Notice: Subject to any disclaimer, the term of this patent is extended or adjusted under 35 U.S.C. 154(b) by 0 days.

(21) Appl. No.: 11/543,417

(22) Filed: Oct. 4, 2006

(51) Int. Cl.
*H01L 25/00* (2006.01)
*H03K 19/177* (2006.01)

(52) U.S. Cl. .............................. 326/47; 326/41; 326/93

(58) Field of Classification Search .................. 326/37, 326/41, 47, 93
See application file for complete search history.

(56) References Cited

U.S. PATENT DOCUMENTS 5,254,886 A * 10/1993 El-Ayat et al. ................ 326/41
5,712,579 A * 1/1998 Duong et al. .................. 326/93

* cited by examiner

*Primary Examiner*—Anh Q. Tran
(74) *Attorney, Agent, or Firm*—File-EE-Patents.com; Jay A. Chesavage

(57) ABSTRACT

A programmable logic fabric includes configurable logic block (CLB) containing registers and combinatorial logic elements. An input switch matrix distributes incoming signals to CLB inputs or inputs of embedded logic elements including a register clock. A routing network allows a variety of routing paths with distinct delays to be selected to route the CLB outputs to the input switch matrices. Presented clock delay insertion architectures allow a leaf node of dedicated clock network and a register clock input can be alternatively routed through the routing network, thereby allowing for the generation of a variable amount of clock delay. Required clock delay for each register minimizing the clock period is computed by clock skew optimization program. A set of alternative clock routes is generated for each register clock where each route delay is close to the corresponding required delay while satisfying the monotone increasing conditions. Optimal clock route for each register clock can be efficiently selected from the alternative clock routes by an integer monotonic program to reduce the clock period of a custom design implemented in the fabric.

20 Claims, 8 Drawing Sheets

1

APPARATUS AND METHOD FOR CLOCK SKEW ADJUSTMENT IN A PROGRAMMABLE LOGIC FABRIC

FIELD OF THE INVENTION

The present invention relates to the clock skew adjustment in a programmable logic fabric for use in cycle-stealing clock distribution to improve the performance of the design implemented in the logic fabric.

BACKGROUND OF THE INVENTION

A synchronous digital circuit comprises combinatorial logic circuitry and register elements. The register elements, such flip-flops responsive to a rising or falling edge of a periodic clock signal, store current logic states. The combinatorial logic circuitry computes the new logic states based on the current logic states and the computed logic states are stored to the registers on the next clock edge.

FIG. 1 shows a generalized prior art single clock synchronous circuit 100, where a clock source 110 drives individual register clocks via a clock distribution network 120. Clock distribution network 120 is ordinarily designed to minimize clock skew, which may be defined as variations in the propagation delays from the clock source 110 to the clock input of the registers 140, 150, etc. In order to clock all the registers simultaneously, propagation delays between the clock source 110 and clock input of each register 140, 150, etc, denoted as X1 through Xn, must be exactly the same. Between each stage of register is combinatorial logic circuitry 130 with lumped signal propagation delays denoted as Dij which is a summation of clock to Q delay of REGi 140 and the propagation delay from an output of REGi 140 to a data input of REGj 150, through the input 131 and the output 132 of the combinatorial logic circuitry 130. FIG. 1 illustrates a simple combinatorial delay path from a register 140 output to the data input of a register 150 for simplicity, however any synchronous input of a register such as clock enable and synchronous set/reset could be an end point of the delay path. In general, the delay value of Dij varies from MINij to MAXij, the minimum and maximum delay values of Dij, respectively. The value of propagation delay between an input 131 and an output 132 of a combinatorial logic circuitry 130 may vary when there are multiple signal paths between the input 131 and the output 132. Variations in manufacturing process, operating voltage and temperature also affect the delay values.

To ensure correct circuit operation for each register, the following two constraints must hold for every combinatorial path from REGi to REGj with propagation delay (MINij, MAXij);

| | |
|---|---|
| Xi + MINij ≧ Xj + HOLDj | (CONS-1) |
| Xi + MAXij + SETUPj ≦ Xj + P | (CONS-2) | where p denotes the operating clock period, HOLDj and SETUPj correspond to hold and setup time of REGj, respectively, and Xi and Xj are the individual clock delays applied to REGi and REGj, respectively. The first constraint CONS-1 ensures that the output of REGi generated by a clock edge arrives at REGj no sooner than HOLDj amount of time after the latest possible arrival of the same clock edge. The second constraint CONS-2 ensures that the output of REGi generated by a clock edge arrives at REGj no later than SETUPj amount of time before the earliest arrival of the next clock edge with period P.

Clock skew optimization, often denoted as "cycle-stealing", is a technique to minimize the clock period of a synchronous circuit by adjusting the path delays of the clock signal from the clock source to the clock input pin of individual register elements. The clock skew optimization problem was first formalized in the journal article entitled, "Clock Skew Optimization," by J. P. Fishburn, which appeared in "IEEE Transactions on Computers," pp. 945-951, July 1990. According to this article, if we consider P and Xi as unknown variables, then the problem of minimizing P, while satisfying the constraints CONS-1 and CONS-2 for every pair of registers REGi and REGj, is formulated as following linear equations:

| | | |
|---|---|---|
| CLOCK_SKEW_OPTIMIZATION (P) | | |
| Minimize P | | |
| subject to Xj − Xi ≦ MINij − HOLDj | (EQN-1) |
| Xj − Xi + P ≧ MAXij + SETUPj | (EQN-2) | for 1≦i≦n, 1≦j≦n, where n is the number of registers in a same clock domain.

The above clock skew optimization problem can be efficiently solved by the Bellman-Ford algorithm coupled with a binary search described in the conference paper entitled, "A Graph-theoretic Approach to Clock Skew Optimization," by R. B. Deokar and S. S. Sapatnekar, Proc. ISCAS, pp. 1407-1410, 1994. The Bellman-Ford algorithm is described in the textbook entitled, "Introduction to Algorithms," by T. H. Cormen et al, pp. 532-543, MIT Press, 1993.

For the zero clock skew case, where Xi equals to Xj for all i and j, equation EQN-2 is reduced to P≦MAXij+SETUPj, meaning that the minimum clock period P is equal to a summation of the largest combinatorial logic path delay and setup time of the register, which is often called "critical path delay". In this case, the minimum period P is just a feasible solution, not necessarily an optimal solution. In general, it is possible to achieve an optimal clock period that is smaller than the critical path delay by utilizing non-zero clock skew computed by solving the previously described linear equations.

FIG. 2 shows a prior art programmable logic fabric 250, the internal architecture of the programmable logic device such as an FPGA (Field Programmable Gate Array), in which a custom circuit is implemented, comprising a plurality of configurable logic blocks 230, configurable input/output (I/O) blocks 210, the routing network 220 and the configuration memory 240.

The configuration data stored in configuration memory 240 define the desired functionality of embedded logic elements of the configurable logic 230 and I/O blocks 210 and generally also turn switch elements of the routing network 220 on or off to properly interconnect those blocks together. The configuration memory 240 can be any type of storage device including static RAM (SRAM), EPROM, EEPROM, flash memory, fuse, anti-fuse, or mask programmable metallization such as via. User designed custom circuits can be implemented by properly programming the configuration memory 240 of the fabric 250, where the content of the configuration memory or configuration data is typically created by starting with a design description usually written in a HDL (Hardware Description Language) 260 which is read by a design implementation tool 270 which comprises a set of software applications such as synthesizer, mapper, placer, router and bitstream generator which generates configuration data 280, which is written into configuration memory 240 of the programmable logic fabric 250, optionally using programmer 290. Typical prior art design implementation tool chain is shown as the steps of 810 in FIG. 8. The behavior of a custom design to be implemented in a programmable logic fabric is described in HDL 812 such as Verilog and VHDL. The synthesizer takes the description along with the design constraints 811 including timing requirements, and produces a "netlist" which describes the connectivities among the library elements modeled after the logical components embedded in the fabric such as LUT and register. The netlist is then processed by the mapper producing another type of netlist, often called "technology mapped netlist", representing the connectivities among the architecture specific features such as configurable logic block and configurable I/O block, by packing the library elements into these blocks. The functionalities of the library elements packed into a block and their intra-block connectivities are converted to the configuration bits representing the functionality of the block containing these library elements. The mapped netlist is taken to the placer in which each block in the netlist is assigned to a specific location in the fabric. The router realizes required interconnections among the placed blocks by selecting wire segments and switch elements within the fabric's routing resources. The bitstream generator 870 takes the routed design 815 and converts it to bitstream file 875 that can be used to configure the programmable logic fabric. In general, the performance of the implemented circuit largely depends on the quality of the implementation software. The configuration memory 240 must be programmed with the design-specific configuration data 280 prior to logic circuit operation of the fabric.

Configurable I/O blocks 210 of programmable logic fabric 250 provide an interface between the logic fabric internals and the external circuitry through the I/O ports 251. For a stand-alone FPGA, those blocks are connected to input/output pads. For an FPGA core embedded in an ASIC (Application Specific Integrated Circuit), the I/O blocks might be connected to the internal nodes of circuit implemented in the other portion of ASIC. Configuration memory bits are used to control the direction of I/O signal flow, driving strength of output buffer, signal registering and many other configurable parameters.

The routing network 220 of logic fabric 250 distributes the internal signals. FIG. 3 shows a prior art routing network 310 comprising a plurality of switch multiplexers 320 330 connected together by a plurality of wire segments 340. The inputs of the routing network drive some inputs of the constituent switch multiplexers and the outputs of the routing network are extended from some outputs of the switch multiplexers. Typically, each input drives the multiple switch multiplexers and there exist multiple routable paths between a route pair having an input and an output. The number and widths of switch multiplexers, and their connectivity patterns vary depending on the fabric architecture. The switch multiplexer 320 comprises a plurality of programmable switch elements and the output of the switch multiplexer is usually buffered in the deep-submicron programmable logic fabric. The routing network typically incorporates various wire segments with different length where a short wire is used for fast local interconnect, while a long wire is for distributing high-fanout signal traveling longer distance. An exemplary buffered switch multiplexer comprising a buffer 321 and a plurality of pass transistor switches 322, each controlled by a configuration memory bit 323 is shown in FIG. 3. Two wire segments extended from the input 311 and the output 312 of the routing network 310 can be connected or disconnected by programming a configuration memory bit 323 which controls the on-off state of switch element 322. Similarly, the input 311 and the output 313 of the routing network 310 can be connected by turning on the switch element 322 and another switch element connected to the input 331 of the switch multiplexer 330. In this case, the routed path between 311 and 313 passes through two switch elements. In general, the more the switches in a routed path, the larger the delay in the path. The buffer 321 could be an inverter or a tristate buffer. In this "active" interconnect scheme, each routing switch connection is buffered at the output, which provides a constant interconnect delay independent of the signal fanout. This makes it easier to predict the interconnect delay during a timing-driven map, place and route process that helps to deliver the better performance. However, the signal can only be driven from input to output in a buffered switch multiplexer while it may be driven in both directions in an unbuffered switch multiplexer. Since only one switch element in a switch multiplexer can be turned on at a time, the switch elements may be controlled by encoded memory bits rather than individual memory bits. Also, a wide input switch multiplexer may be constructed in multi-level switches forming a tree structure rather than flat, single-level switches 320 as shown in FIG. 3. A typical routing network incorporates various types of switch multiplexers such as buffered or unbuffered output, wide or narrow or even single input, encoded or unencoded control memory bits, and single-level or multi-level switches. Various types of prior art switch elements may be used, including a pass transistor 322, transmission gate, fuse, anti-fuse, mask programmable via/metal segment, or any type of programmable switch element known in the prior art.

Due to the high-fanout nature of the clock signal 110 shown in FIG. 1, most programmable logic fabric incorporate a dedicated clock distribution network to efficiently distribute the clock signals to every register element with minimal clock skew. Modern FPGA devices contain hundreds of thousands of register elements 140 150 of FIG. 1.

FIG. 4 shows a typical clock distribution network 400 employed in a prior art programmable logic fabric. The clock tree typically comprising the root node 450, horizontal spines 451, vertical spines 452, the leaf nodes 453, and associated buffers 454, is designed in such a way that the delay from the root node 450 to each and every clock input of the register elements 460 driven by the leaf nodes 453 are equalized so as to minimize the clock skew from one register 460 to another register 460, thereby providing a substantially similar delay from one clock leaf to another. The clock source 420 may originate from an internal clock source or an external source connected to the clock input pin. In a direct distribution configuration, the clock source multiplexer 440 selects the clock source 420 directly, and distributes this root node 450 to horizontal spines 451, which are then coupled to a set of vertical spines 452, which buffer the clock signal and apply them to the registers 460 via leaf nodes 453. In this configuration, each register has the same clock delay which is the propagation delay of the clock tree. In a PLL (Phase Locked Loop) or DLL (Delay Locked Loop) distribution configuration, the multiplexer 440 selects an output of PLL/DLL 430 which generates an internal clock synchronized to the incoming source 420 using feedback 431. In the prior art implementation of FIG. 4, one leaf node 453 feeds back to an input 431 of PLL/DLL 430 to synchronize the clock phase of the signal distributed to the registers via leaf nodes with the external clock source 420, thereby compensating for the propagation delay of the clock tree. In this manner, the plurality of register elements 460 on each of the leaf nodes 453 can be synchronized to a single incoming clock source 420. The clock source multiplexer 440 may select a signal from the routing network 410 to distribute the clock signal derived from the clock source 420 such as a gated clock signal. A dedicated and balanced clock tree embedded in the programmable logic fabric allows the reliable clocking of registers at synchronous points in time with minimal clock skew from one register to another. On the other hand, a clock signal routed through general purpose routing resources can not be synchronized with the clock source and may incur a large amount of clock skew due to uneven route-dependent clock delays associated with undesirable clock signal routing paths. It is a common practice to embed a plurality of the clock trees into the fabric to distribute multiple minimum skew clock signals as typical applications require.

FIG. 5 shows a configurable logic block (CLB) 501 along with the input switch matrix (ISM) 502, clock tree leaf nodes 510, and the routing network 503. The CLB 501 comprises a plurality of configurable logic elements including configurable register element 540 and configurable combinatorial logic elements such as LUT (Look-Up Table) 530. There may be several identically structured LUTs, registers, and multiplexers, such as 531, 532, 541, 542 and 550, as well as complex logic elements such as arithmetic logic and wide-input multiplexers, not shown herein for simplicity. For a LUT-based fabric, desired combinatorial logic functions can be implemented by programming the configuration memory bits (not shown) representing LUT contents. For example, a 4-input LUT (LUT4) which contains 16 bits of memory can realize any 4-input, 1-output Boolean logic function by implementing a fully populated 4-input, 1-output truth table, as known in the prior art. The register element may have other control inputs, or optional ports, such as set/reset and clock enable pins which are not shown herein for simplicity. Various modes of register 540 operation can also be configured by programming the configuration memory bits (not shown) associated with register functionality such as the polarity of clock edge, synchronous set/reset mode, flip-flop/latch mode, and other prior art register functions. The ISM 502 comprises an array of the switch multiplexers where the output of each multiplexer drives at least one CLB input and the inputs of each multiplexer are connected to some of the incoming wires from the leaf nodes of clock trees 504, the outputs 505 of routing network 503, the bounce-back 506, or the feed-back 525. The incoming wires to ISM 502 are represented in vertical lines in the FIG. 5. The horizontal lines in ISM 502 arrowed to CLB inputs correspond to the output wires of switch multiplexers driving CLB inputs. The directional switch elements 503 of the multiplexers, denoted as '>' marks, are sparsely populated at the cross points between the incoming wires and the output wires of the multiplexers. The number and the locations of the switch elements on the ISM 502, translated to the width and input connection pattern of the switch multiplexers, vary depending on the fabric architecture. Signals presented on the incoming wires to ISM 502 are routed to inputs of the CLB 501 by turning on the appropriate switch elements on the ISM 502. For example, a global clock signal distributed through leaf node 511 can be routed to the clock pin of register 540 by turning on the switch element 512 in the clock selection multiplexer 560. Similarly, a locally generated clock signal distributed through the output 521 of the routing network 503 can be routed to the register 541 by turning on the switch element 522 in the clock selection multiplexer 561. Signals can also be selected through the switch multiplexers reside in CLB. For example, D-input signal of register 541 can be selected from either LUT4 531 or the output 551 of data input multiplexer 573 in ISM 502 through properly configured data select multiplexer 550 in CLB 501. The switch configuration data, representing on-off state of the switches, usually created by the router, is stored in the configuration memory as described earlier. Unlike other switch multiplexers in ISM 502, the clock selection multiplexer 560 561 562 takes the inputs from the leaf nodes of clock trees 504. It may also take the inputs from the routing network 505 to distribute any locally generated clock signals such as a registered clock signal generated by a sequential circuit such as a divide-by-N counter. The clock selection multiplexer may drive more than one clock input and may comprise multiple-levels of the switch multiplexers. Although the embedded clock trees are dedicated to distribute high-fanout clock signals to the clock pins, it would be useful to utilize unused clock trees for routing high-fanout signals to any inputs of the logic elements other than clock inputs. For example, in the Virtex-4 architecture from Xilinx Inc., the input access of the global clock lines are not limited to the clock pins of the logic resources—the leaf nodes of the global clock tree can access other inputs in the CLBs such as LUT inputs and the set/reset inputs of the register. This may be done through the clock signal "bounce-back" structure, a 2-level multiplexer structure formed as the clock selection multiplexer 560 to the LUT input selection multiplexers 570 571 572 through the bounce-back wire 514. For example, a high-fanout signal distributed through the leaf node 511 can be switched to the bounce-back wire 514 by turning on switch 512 in clock selection multiplexer 560 and it can be routed to each input of LUT4s 530, 531 and 532, through switches 515, 526 and 527, respectively. Outputs from the embedded logic elements of the CLB 501 such as LUT4 530 and register 540 drive the inputs of routing network 503 and some outputs may feed back 525 to the ISM 502 for cascading other logic elements in the same CLB with minimal interconnect delay. For example, the output of LUT4 531 can be routed to an input of LUT4 530 through the feed-back wire 525 and switch 528 forming a fast, single-switch routing path.

To maximize the operating frequency of a circuit by adjusting the clock skew, a special apparatus for implementing adjustable clock skew and corresponding method for utilizing the apparatus are required in a programmable logic fabric.

U.S. Pat. Nos. 6,873,187 and 6,486,705 by Andrews et al introduced the fractional cycle stealing units 580 in the routing of FPGA. The delay lines 582 583 584 585 in the unit 580 have distinct delay amounts that must be pre-defined prior to the chip fabrication. A modified Bellman-Ford algorithm selects a particular one of the selectable delay lines 582 583 584 585 through a configurable multiplexer 581 for each of the units to increase system performance resulting from the particular clock routing. This approach requires significant hardware cost to implement the selectable delay lines of the units for every clock input of register elements, and it is difficult to pre-define a good set of delay values for the selectable delay lines covering wide range of the applications with different performance requirements.

The publication "Constrained Clock Shifting for Field Programmable Gate Array" by Singh and Brown, Proc. 10th International Symposium on Field Programmable Gate Arrays, Monterey, Calif., pp. 121-126, February 2002, utilizes unused dedicated clock networks to distribute a finite set of clock skews to the every registers. Clock skews are generated by a phase shifting circuitry on the clock network. The advantage of this approach is minimal hardware overhead, however, it is not applicable when all the dedicated clock lines are consumed by multiple clock signals in a custom design with multiple clock domains.

The publication by C. Y. Yeh, M. Marek-Sadowska, "Skew-programmable Clock Design for FPGA and Skew-aware Placement" (Proc. 13th International Symposium on Field Programmable Gate Arrays, Monterey, Calif., pp. 33-40, February 2005) describes embedding programmable delay elements into the major branches of the clock tree such as the buffer 454 locations in FIG. 4. The hardware overhead of this approach may be lower than the approach of Andrews but it also requires a pre-defined set of fixed delay elements. Another drawback of this approach is that it requires a special placement algorithm which takes the delay-embedded clock trees into consideration.

OBJECTS OF THE INVENTION

A first object of the invention is an architecture for clock distribution in a programmable logic fabric which allows for granular control of clock delays to each register element.

A second object of the invention is a method for controlling the clock distribution in a programmable logic fabric to allow granular control of clock delays to each register element.

A third object of the invention is a method for finding the clock routes for a custom design implemented in a programmable logic fabric to minimize the operating period of the clock signal.

SUMMARY OF THE INVENTION

A programmable logic fabric includes a configurable logic block which has a plurality of configurable combinatorial logic elements and a plurality of configurable register elements. The configurable logic blocks are interconnected through a routing network. Ordinarily, a dedicated clock network in the logic fabric distributes a global clock signal to the clock pin of the register elements with the minimal clock skew. The present invention allows a global clock signal distributed through the dedicated clock network to be directly connected to the routing network so that the global clock signal is alternatively routed to the clock pin of a register element through the routing network, where the delay of the alternative route passing through the routing network can be used to introduce a desired amount of clock skew. In this manner, configurable clock delays for some registers may be established on a cycle-stealing clock distribution network to minimize the clock period of a synchronous circuit containing those registers.

DETAILED DESCRIPTION OF THE INVENTION

In contrast to prior art cycle-stealing configurations relying on dedicated delay line hardware with fixed delay amounts, the present invention synthesizes the delay lines with fine-grain, wide-range delay amounts by utilizing the logic and routing resources that are remaining after a custom design is completely implemented in the programmable logic fabric where the clock signals are usually routed with minimal skew wherever possible.

Figure 3:
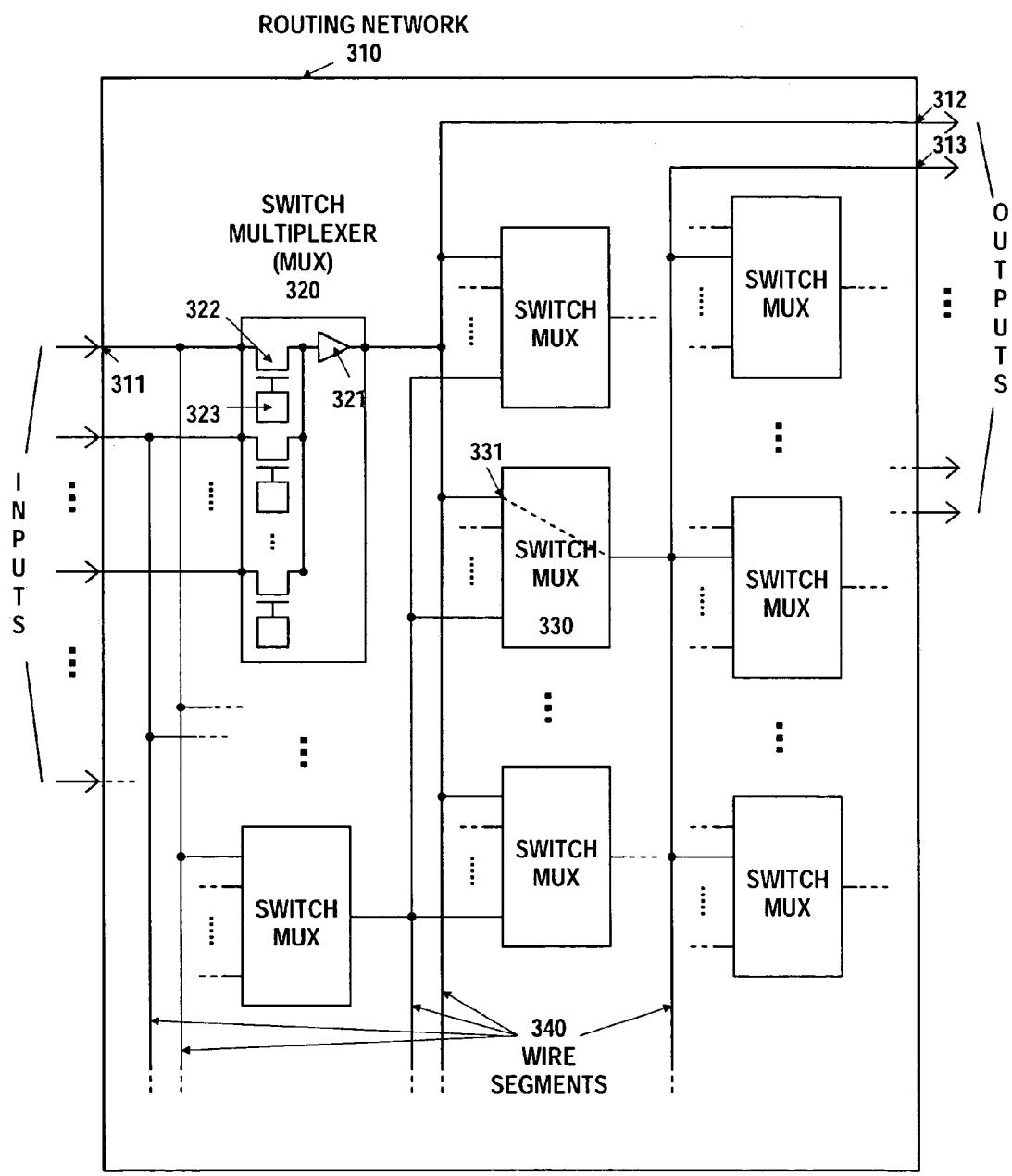
FIG. 3 shows a block diagram for a prior art routing network based on the switch multiplexers of a programmable logic fabric.
Figure 4:
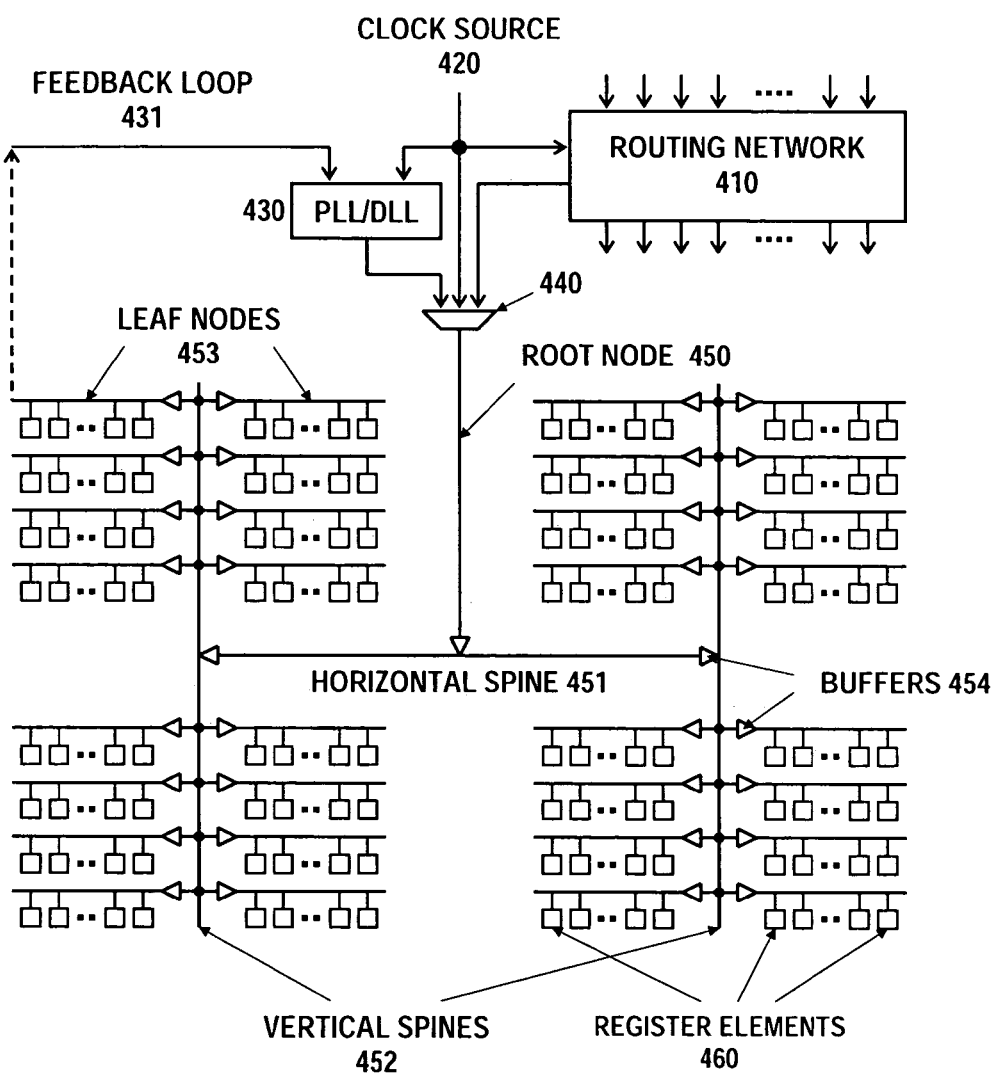
FIG. 4 shows the block diagram for a prior art dedicated clock distribution network for a programmable logic fabric.
Figure 5:
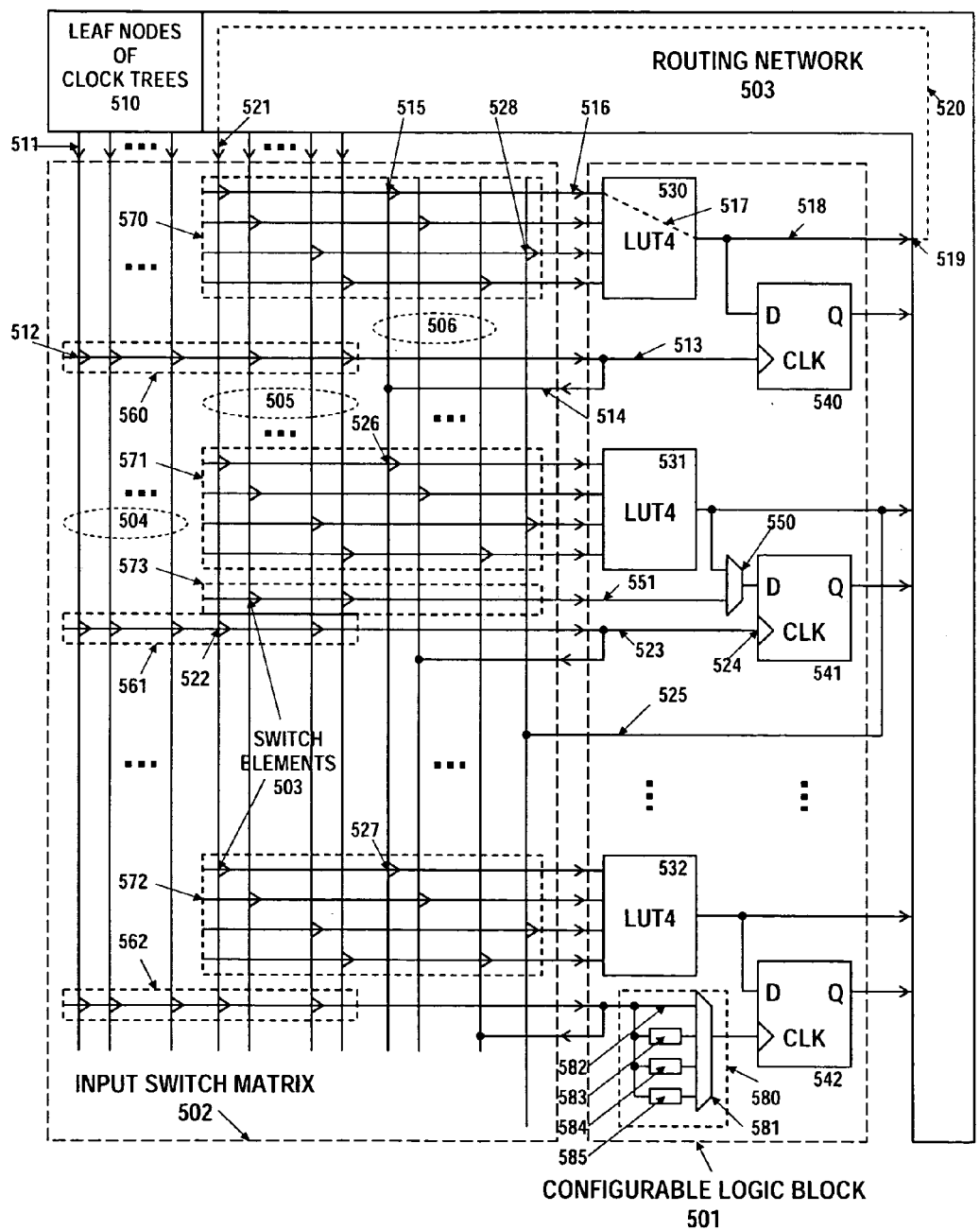
FIG. 5 shows the block diagram for a prior art programmable logic fabric including a configurable logic block, an input switch matrix, and the routing network.

There are two types of delay elements in the programmable logic fabric: logic delay and interconnect delay. The logic delay is the propagation delay of a combinatorial path of a logic component such as a delay of input-to-output path 517 in LUT4 530 of FIG. 5. The interconnect delay, or route delay, is a propagation delay associated with a routed path connecting one logic component to another such as the delay of a routing path from input 311 to output 313 in the routing network 310 of FIG. 3. An interconnect delay associated with a single wire segment includes a propagation delay of the switch multiplexer connected to the wire segment. Desired amount of delay can be synthesized by properly cascading a series of interconnect delays and logic delays to form a delay line. Since the interconnect delay of a short wire segment is usually smaller than any logic delays, a delay line with a small delay value may be composed by cascading one or more short wire segments without going through any logic elements. Additionally, a delay line with a large amount of delay may be composed by chaining the LUTs where each LUT is configured as a "route-through" buffer of which output signal is a delayed copy of an input signal.

Since modern programmable logic fabric contains abundant routing resources for easier routing and predictable performance, a large portion of routing resources are left unused even after the design is completely routed. Also, most fabric employs an active interconnect scheme where each routing switch connection is buffered at the output providing a constant interconnect delay independent of the signal fanout. These two properties make the leftover routing resource to be used as an ideal delay element to synthesize the delay line.

Figure 6:
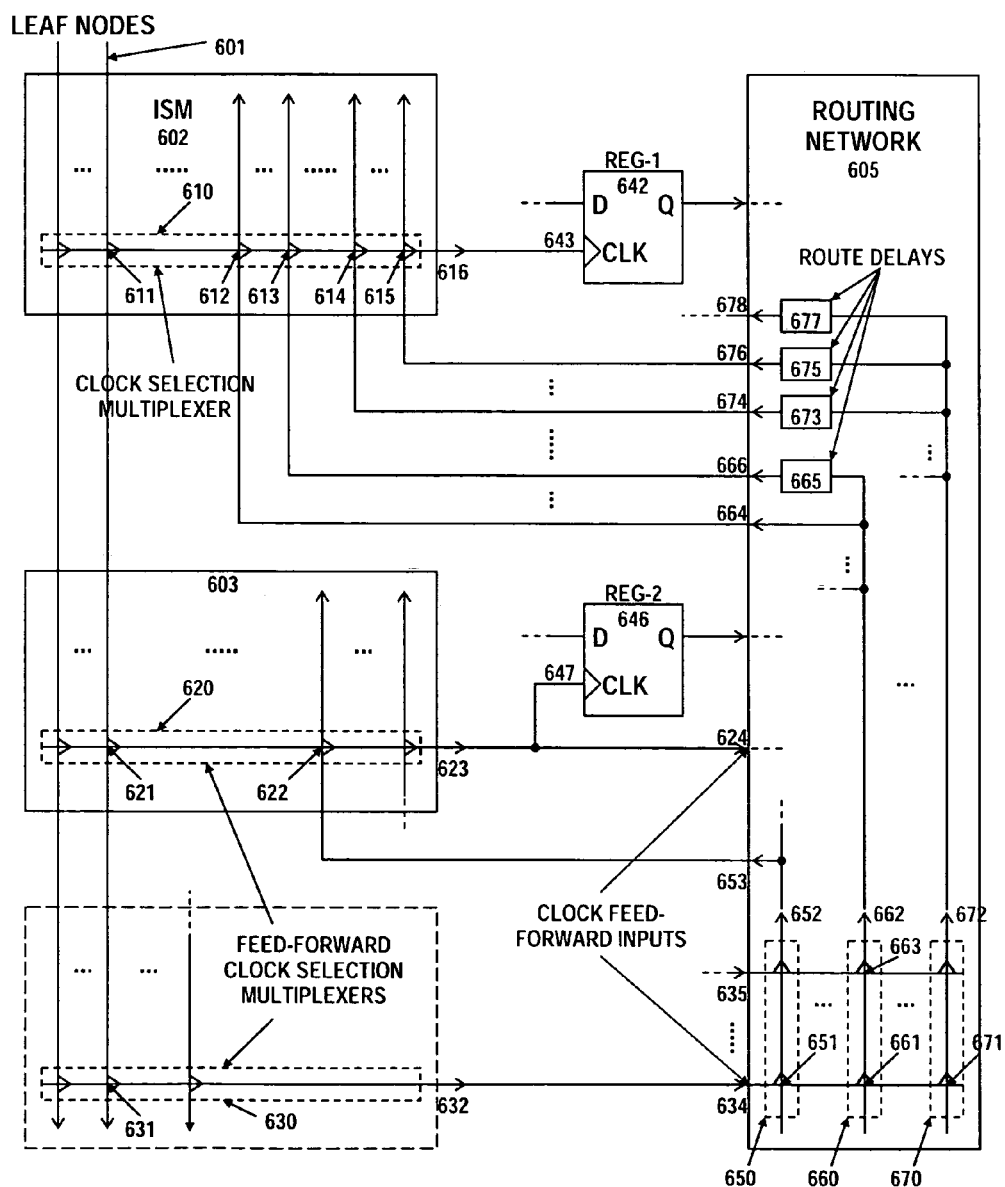
FIG. 6 shows the block diagram for a plurality of register elements with a clock signal feed-forward architecture operating in a cycle-stealing configuration.

FIG. 6 shows the clock feed-forward architecture of the present invention where the two register elements REG-1 642 and REG-2 646 are clocked by a global clock signal distributed through a leaf node 601 of a clock tree. It includes two "feed-forward" clock selection multiplexers 620 630 driving the routing network 605 through the clock feed-forward inputs 624 634, in addition to an ordinary clock selection multiplexer 610 whose output 616 solely drives the logic elements such as the clock input 643 of REG-1 642 as was shown for the prior art of FIG. 5. The feed-forward clock selection multiplexers 620 630 make it possible to insert the clock delay composed by the interconnect delay elements in the routing network 605. The routing network 605 coupled to the input switch matrices 602 603 provides a plurality of routing paths between each pair of the clock feed-forward input 624 634 and the clock input 643 647 of a register 642 646 where each alternative routing path may have a distinct delay value. For the ordinary minimal-skew clock routing, the global clock signal on the leaf node 601 is routed to the clock pin of each register, 643 and 647, by turning on the switch elements, 611 and 621, of the clock selection multiplexers, 610 and 620, respectively. For the cycle-stealing mode, the leaf node 601 to the clock input of each register 643 647 is routed through an alternative clock route in the routing network 605 where the route is selected in such a way that the route delays for each register clock result in the minimal clock period. If REG-1 642 requires very small clock delay, then an alternative clock route with the minimal amount of delay may be selected through the shortest interconnect delay path from the feed-forward input 634 to the clock input 643 of REG-1 642, where the global clock signal switched to clock feed-forward input 634 via switch 631 is fed to switch 661 of switch multiplexer 660 and the multiplexer output 662 is directly connected to switch 612 of the clock selection multiplexer 610 through the output 664 and switched to clock input 643 of REG-1 642 via switch 612. Similarly, the minimal delay may be added to clock input 647 of REG-2 646 through 601, 631, 632, 634, 651, 652, 653, 622, 623 to 647. To insert a nominal clock delay to REG-1 642, the clock signal may go through following path: the global clock driving leaf node 601 to switch 631 of feed-forward clock selection multiplexer 630 to clock feed-forward input 634 of the routing network 605 to switch 661 of switch multiplexer 660 to a route delay 665 comprising a plurality of interconnect delay elements, wire segments and switch elements, to switch 613 of the clock selection multiplexer 610 to the clock input 643 of REG-1 642. In this case, the total amount of clock delay added to clock input 643 of REG-1 642 is a summation of a switch multiplexer 660 delay, the route delay 665 and the clock selection multiplexer 610 delay by assuming that the delays from leaf node 601 to the clock selection multiplexer output 616 and the feed-forward clock selection multiplexer output 632 are same. While shown without configurable combinatorial logic elements for clarity, a long clock delay may be added by properly combining the interconnect delays and the logic delays of the "route-through" logic elements. For example, consider the output 678 of routing network 605 connected to the input multiplexer of a route-through logic element such as LUT and the output of the logic element in turn drives the input 635 of the routing network 605. In such configuration, a long delay may be inserted to the clock input 643 of REG-1 642 via following clock signal path: leaf node 601, switch 631, clock feed-forward input 634, switch 671, route delay 677, routing network output 678, input multiplexer of the route-through logic element, input-output delay path of the logic element, routing network input 635 driven by the logic element, switch 663, route delay 665, routing network output 666, switch 613, to the clock input 643 of REG-1 642.

The dedicated feed-forward clock selection multiplexer 630 neither has to reside in any ISM nor needs to take any inputs from the routing network 605 outputs unlike other clock selection multiplexers 610 620. However, other type of feed-forward clock selection multiplexer 620 which drives both clock input 647 of REG-2 646 and clock feed-forward input 624 of the routing network 605 may reside in ISM 603 and it feeds a clock signal to the routing network identical to REG-2 clock signal. While shown without CLB groupings for clarity, the clock selection multiplexers 610, 620 may reside in the same ISM, or in the different ISMs, i.e., REG-1 642 and REG-2 646 may reside in a single CLB, or in different CLBs.

Figure 7:
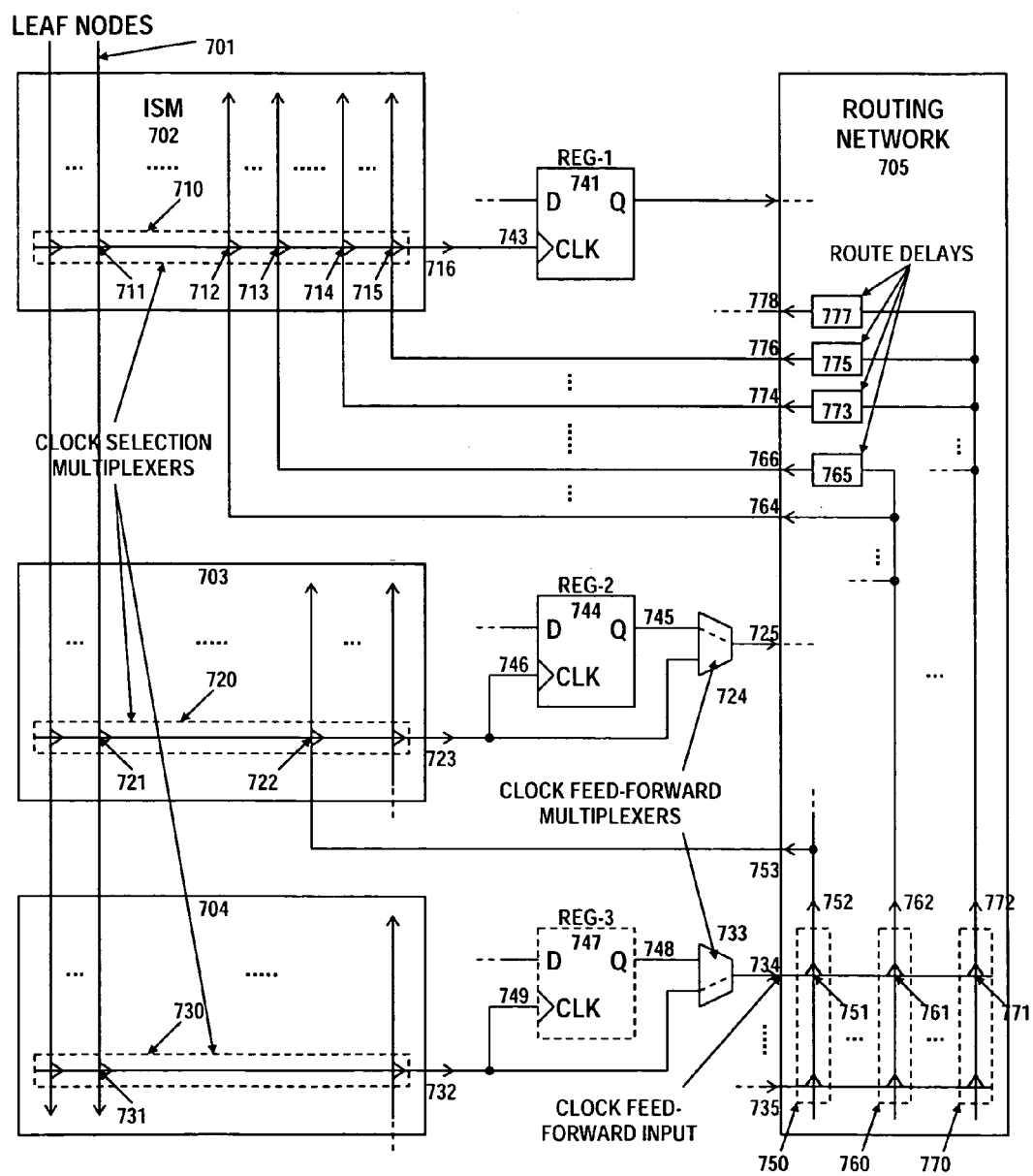
FIG. 7 shows a plurality of register elements with local clock feed-forward multiplexers operating in a cycle-stealing configuration.

In the cycle-stealing clocking architecture of FIG. 6, the routing network 605 requires additional feed-forward clock inputs 624 634 fed from the feed-forward clock selection multiplexer outputs 623 632, which increase the size of the connecting switch multiplexers 650 660 670 by adding additional switch elements 651 661 671. The additional switch elements in the switch multiplexer often increase propagation delay of the multiplexer due to the increased capacitive loading, thereby adding undesirable delay to any routing paths switched through the multiplexer. It may also be noted that the dedicated feed-forward clock selection multiplexers 630 claim the additional silicon area. FIG. 7 shows one possible variation of FIG. 6 where the addition of a configurable multiplexer selects between the register output and the register clock input, sending the selected signal to the routing network. The number of inputs of the routing network is now the same as the prior art FIG. 5 for an identical architecture, while having the clock delay insertion flexibility as was shown in FIG. 6.

FIG. 7 shows alternative embodiment 700 of FIG. 6 whereby each register 744, 747 has a clock feed-forward multiplexer 724, 733, respectively, which locally multiplexes an output of register 745, 748, respectively, and a clock input of register 746, 749, respectively, which is driven by a clock selection multiplexer output 723, 732, respectively. In this embodiment, a clock signal can feed to the routing network input 725, 734 only when the register output 745, 748, respectively, is not utilized since they share the same input to the routing network. In FIG. 7, the routing network input 734 can only be a valid clock feed-forward input since clock feed-forward multiplexer 733 is configured to select clock input 732 while other clock feed-forward multiplexer 724 is configured to select register output 745 as indicated by a dashed line in the multiplexer. The use of a multiplexer to select either a register output or a register clock to couple to the routing network does not practically limit the clock feed-forwarding capability since modern programmable logic fabric contains abundant registers and typical register utilization is around 50-70%, i.e., 30-50% of total available registers are not utilized and their output multiplexers may be configured as the feed-forward clock sources. The feed-forward clock configuration of FIG. 7 is similar to the one illustrated for FIG. 6 whereby switch 731 couples a global clock which has been distributed to leaf node 701 to clock selection multiplexer output 732, which is coupled to clock feed-forward multiplexer 733 and to feed-forward input 734 of the routing network 705. For a nominal delay, the coupling from switch 761 leads to a route delay 765, which may be composed of any length or number of wire segments as was described in FIG. 3 to generate the required clock delay, which is coupled to clock input 743 of REG-1 741 via switch 713 of clock selection multiplexer 710 of ISM 702. For a short delay, switch 761 may couple to a direct route 764 to switch 712 and to clock selection multiplexer output 716 to clock input 743 of REG-1 741.

It should be noted, however, that any output of a CLB other than a register output can also be multiplexed with the clock selection multiplexer output, and not all the registers in a CLB needs to have multiplexed outputs.

An alternative method inserting clock delay without introducing additional switch elements is to utilize clock signal bounce-back 514 structure described earlier and shown in FIG. 5. Even though it is intended for applications requiring a very fast signal connection and large load/fanout as described in Xilinx's Virtex-4 User Guide, Clock Tree and Nets—GCLK, v 1.4, pp. 32, September 2005, a global clock line to LUT input connection may be utilized to add a clock delay to the global clock signal. One embodiment of the present invention configures the LUT as a buffer so that the global clock signal can "route through" this LUT and through the routing network 503 to reach the clock input of destination register so as to insert the clock delay. For example, one of leaf nodes 511 is switched to the clock selection multiplexer output 513 via switch element 512. The clock selection multiplexer output 513 may be routed to the clock input 524 of destination register 541 via bounce-back wire 514, switch 515, LUT4 input multiplexer output 516, LUT4 530 configured as the route-through buffer 517, LUT4 output 518, and a routing path 520 with required delay amount from clock feed-forward input 519 to output 521 of routing network 503, switch 522 of the clock selection multiplexer 561, the clock selection multiplexer output 523, and clock input 524 of the destination register 541. However, the amount of clock delay that can be added by this routed path is much larger than that by interconnect delay elements as was described in previous embodiments. This method may be used to insert a long clock delay often required in the nominal-performance designs.

Any combinations of previously described clock delay insertion embodiments may be incorporated in a single programmable logic fabric depending on the target application requirements.

Figure 8:
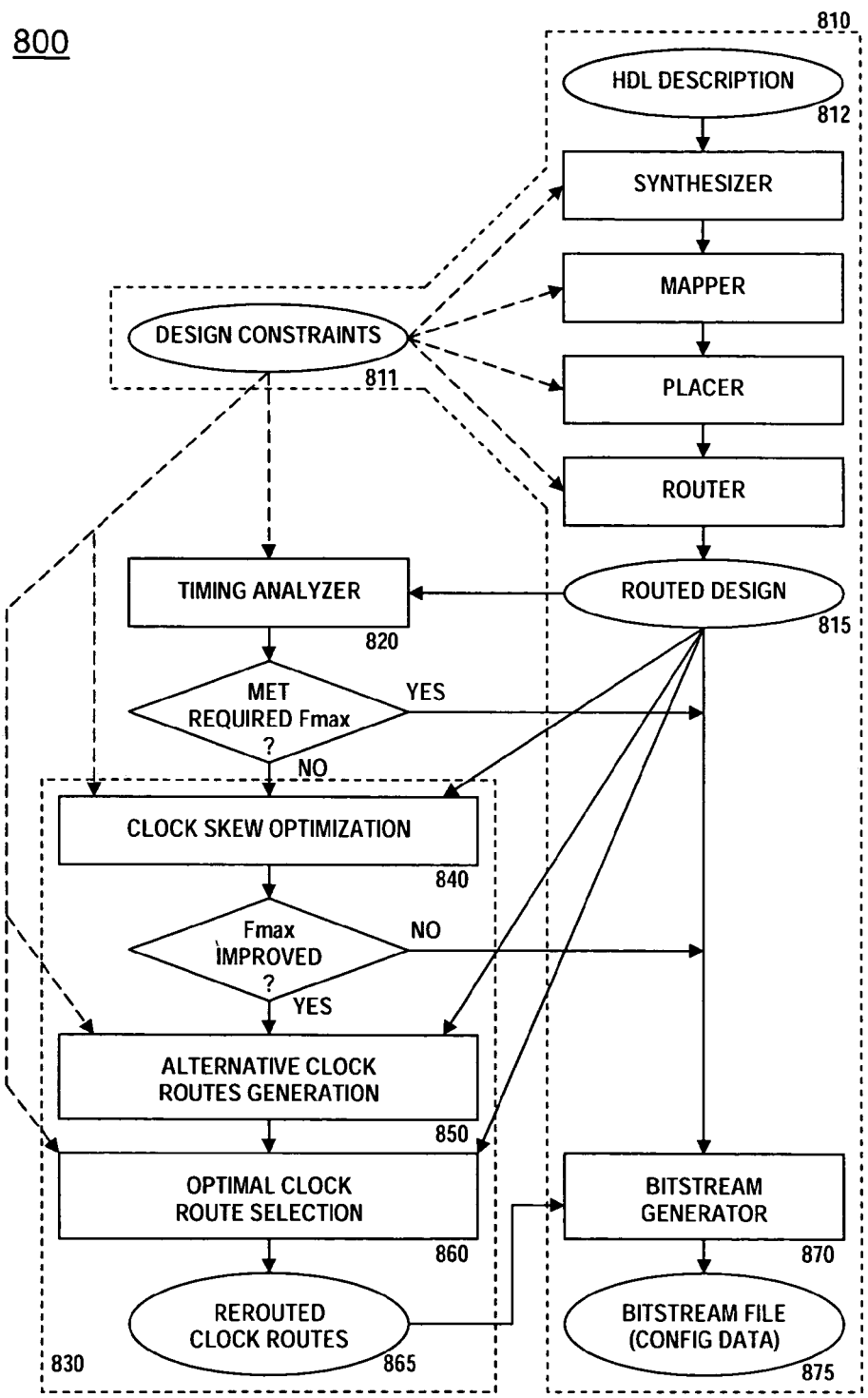
FIG. 8 shows a design flow for implementing a cycle-stealing to reduce the clock period of a custom design.

FIG. 8 shows a design flow for implementing a cycle-stealing to increase the operating frequency of a custom design in accordance with the clock delay insertion architecture and method of the present invention. The prior art method of producing a routed design 815 from an HDL description 812 is shown in the steps of 810 where all the clock signals are routed with the minimal skew wherever possible. The timing analyzer 820 validates the routed design 815 to verify that all the timing requirements defined in the design constraints 811 are met. In the prior art, when a routed design fails to meet the timing requirement, the design or its constraints are changed, and the sequential steps of 810 are performed again to produce yet another routed design.

Conventional clock skew optimization problem described earlier is a continuous optimization problem where the linear equation solver produces a solution set consisting of continuous real numbers corresponding to the amounts of the required clock delays to minimize the clock period. In the programmable logic fabric, it is not generally possible to synthesize a delay line with a delay value exactly equal to the solution value because of the finite set of distinct delay elements available in the logic fabric. Therefore, clock skew optimization problem in a programmable logic fabric is a discrete optimization problem where the solution process must find the solution set from the finite set of available discrete delay values rather than the infinite continuous real number values.

In the present invention, when the maximum operating frequency (Fmax) of one or more clock signals doesn't meet the required frequency of the custom design, three-step procedures 830 are invoked to improve the Fmax under previously described restriction. First, conventional clock skew optimization procedure 840 is initiated to check whether Fmax can be improved. For each clock that doesn't meet the Fmax requirement, a set of the linear equations for the clock delays is formed and solved to determine the clock delay requirement for each register as was described earlier. If Fmax of the clock is improved as a result of the clock skew optimization 840, the computed solution values guide the subsequent procedures, alternative clock routes generation 850 and an optimal clock route selection 860.

Alternative clock routes generation procedure 850 generates a set of routes from any available clock feed-forward inputs to each register clock where delay values of the routes are close to the solution value of each register clock computed by clock skew optimization procedure 840. For example, any routable paths between clock feed-forward input 634 and the clock input 643 of REG-1 642 in FIG. 6 such as paths 634-661-665-666-613-643 and 634-671-673-674-614-643 can be alternative clock routes for REG-1 642 if the delay value of the path is close enough to the solution value of REG-1 computed by clock skew optimization procedure 840. Optimal clock route selection procedure 860 selects a route for each register clock from the corresponding set of alternative clock routes generated for the register clock in such a way that the selected set of the clock routes maximizes the operating frequency of the clock signal.

Steps to find a clock routing path having desired amount of delay in accordance with the invention are described as follows. For each clock, distributed through the dedicated clock network, of which Fmax can be improved by clock skew optimization 840, suppose the design has N-registers, (REG1, ... , REGN), clocked by the same clock source, and the solutions representing desired clock delay for each register, (S1, ... , SN), computed by the clock skew optimization 840 described earlier. The alternative clock routes generation procedure 850 finds an ordered set of alternative delay paths, {Pk[1], ... , Pk[Mk]}, containing one or more paths from the clock feed-forward inputs to the clock pin of each REGk through the routing network, where Mk is a pre-determined parameter corresponding to the maximum number of the alternative clock routes for REGk. MINk[j] denotes the lower bound delay of the alternative clock route Pk[j] and MAXk[j] is the upper bound delay. Upper and lower bound delays are often called "min-max" delays. The delays of the alternative clock routes for REGk must satisfy following monotone increasing conditions:

| MINk[1] < MINk[2] < ... < MINk[Mk] | (COND-1) |
| MAXk[1] < MINk[2] < ... < MAXk[Mk] | (COND-2) |

Alternative clock routes for each register are selected from a plurality of routable paths from any available clock feed-forward inputs 624 634, through the routing network 605, to the clock selection multiplexer 610 620 from which delayed register clock signal is selected to the register clock. They may be found by a path enumeration algorithm over a routing graph representing the routing resources of the fabric. The routing graph is a directed graph where a node of the graph represents a wire segment and an arc of the graph corresponds to a switch element. A "route-through" path which is an input to output delay path of unused combinatorial logic element configured as a buffer, acted like permanently "turned-on" switch element, may be added to an arc of the routing graph when the large amount of clock delay is required. Each arc possesses the min-max delays between two adjacent nodes. These delay values may be accurately characterized by a circuit simulator such as SPICE by considering post-layout parasitic capacitances and resistances as well as various delay variation factors such as voltage, temperature and process variations.

Alternative clock path searching is carried out in a sequential manner, one register clock at a time. For each register, REGk, the first element of the alternative clock routes set, pk[0], is initialized with the direct clock route of REGk directly switched from a leaf node through the clock selection multiplexer, and MINk[0] and MAXk[0] are usually set to zero. Then, Nk-nearest clock feed-forward inputs are located based on the distance from the register being considered, REGk, where Nk is a pre-specified constant parameter. A path enumeration algorithm enumerates all the paths from each node corresponding to the nearest neighbor clock feed-forward inputs to the clock pin of the register. The node corresponding to the clock feed-forward input is annotated to the delay difference between the min-max delays from the clock source to the clock input pin and those from the same clock source to the clock feed-forward input. For each enumerated path, the min-max path delay is calculated and the path is added to the alternative clock route set only if the path delay satisfies the monotone increasing conditions, COND-1 and COND-2, when it is added to the path. If the new addition exceeds the maximum number of the alternative clock routes in the set, Mk for REGk, the path whose delay value has the largest discrepancy against the solution value is removed from the set so that the set keeps the paths whose delays are Mk-closest delay values to the solution for REGk. The discrepancy may be defined as |Sk−MINk[j]|+|MAXk[j]−Sk| for Pk[j]. If the number of alternative paths is less than Mk after considering Nk-nearest clock feed-forward inputs, more clock feed-forward inputs located farther from the clock pin may be considered incrementally to get desired number of alternative clock routes.

Path enumeration is based on an exhaustive search for all possible paths between two nodes in the routing graph and it often requires expensive computation. This search process may be streamlined by pruning out the unlikely paths during the enumeration. Each enumeration, intermediate min-max delay from source node to currently considered node is computed. If the computed maximum delay exceeds a pre-specified tolerance range with respect to the solution value, no further search is necessary from the current node. Similarly, if the minimum delay of a complete path is smaller than a pre-specified value, the path may be discarded immediately. Minimum and maximum tolerable path delays may be bound as $Sk*(1-Lk) \leq MINk[j]$, $MAXk[j] \leq Sk*(1+Uk)$, where $0 \leq Lk \leq 1$, $Uk \geq 0$. Lk and Uk are pre-specified constant parameters defining upper and lower bound tolerance with respect to the solution value.

Since all alternative clock routes for every register driven by the same clock signal don't have to be disjoint each other, part of the routing path from a clock feed-forward input to any node may be shared with other paths. Path sharing creates a connection fanout larger than one. For the fabric employing the active interconnect scheme, it has very little effect on the delay value of an existing path even if a new branch is added to a node of the path by the sharing since the delay of buffered wire is fanout insensitive. This makes path searching process much simpler and consumes less routing resources than finding the disjoint paths.

After executing above steps for each register, a set of alternative clock routes for each register is computed. Then an optimal clock route selection procedure 860 selects the optimal clock route for each register from the set of alternative clock routes to minimize the clock period subject to one or more specified constraints. The problem selecting the optimal clock routes minimizing the clock period P is formulated as follow:

OPTIMAL_CLOCK_ROUTE_SELECTION (P)
  Minimize P
  subject to $MAXj[Zj]-MINi[Zi] \leq MINij-HOLDj$
  $MINj[Zj]-MAXi[Zi]+P \geq MAXij+SETUPj$
  for $1 \leq i \leq n$, $1 \leq j \leq n$, where n is the number of registers in a same clock domain.

Where unknown index variables Zi and Zj are ranged in {1, 2, . . . , Mi} and {1, 2, . . . , Mj}, respectively, Mi and Mj are the numbers of alternative clock routes of REGi and REGj, respectively.

The solution for this problem, an integer nonlinear program, requires expensive computation. However, since the delays of the alternative clock routes were forced to satisfy the monotone increasing conditions, COND-1 and COND-2, the above problem becomes a much simpler problem where the optimal clock route for each register clock input is selected from an array of alternative clock routes arranged as satisfying the monotonically increasing conditions where an index value of the array designating the optimal clock route is obtained by solving an integer monotonic program. Published integer monotonic solution methods for the simplified problem include (i) the Feasibility algorithm in the journal article "Efficient Algorithms for Integer Programs with Two Variables per Constraint," by R. Bar-Yehuda et al, which appeared in Algorithmica, pp. 595-609, April 2001, and (ii) the MonoRelax algorithm in the conference paper "Asymptotically Efficient Retiming Under Setup and Hold Constraints," by M. C. Papaefthymiou, which appeared in Proc. ICCAD, pp. 396-401, Nov. 1998, and (iii) the Monotone-Bellman-Ford algorithm described in U.S. Pat. No. 6,873,187.

Figure 1:
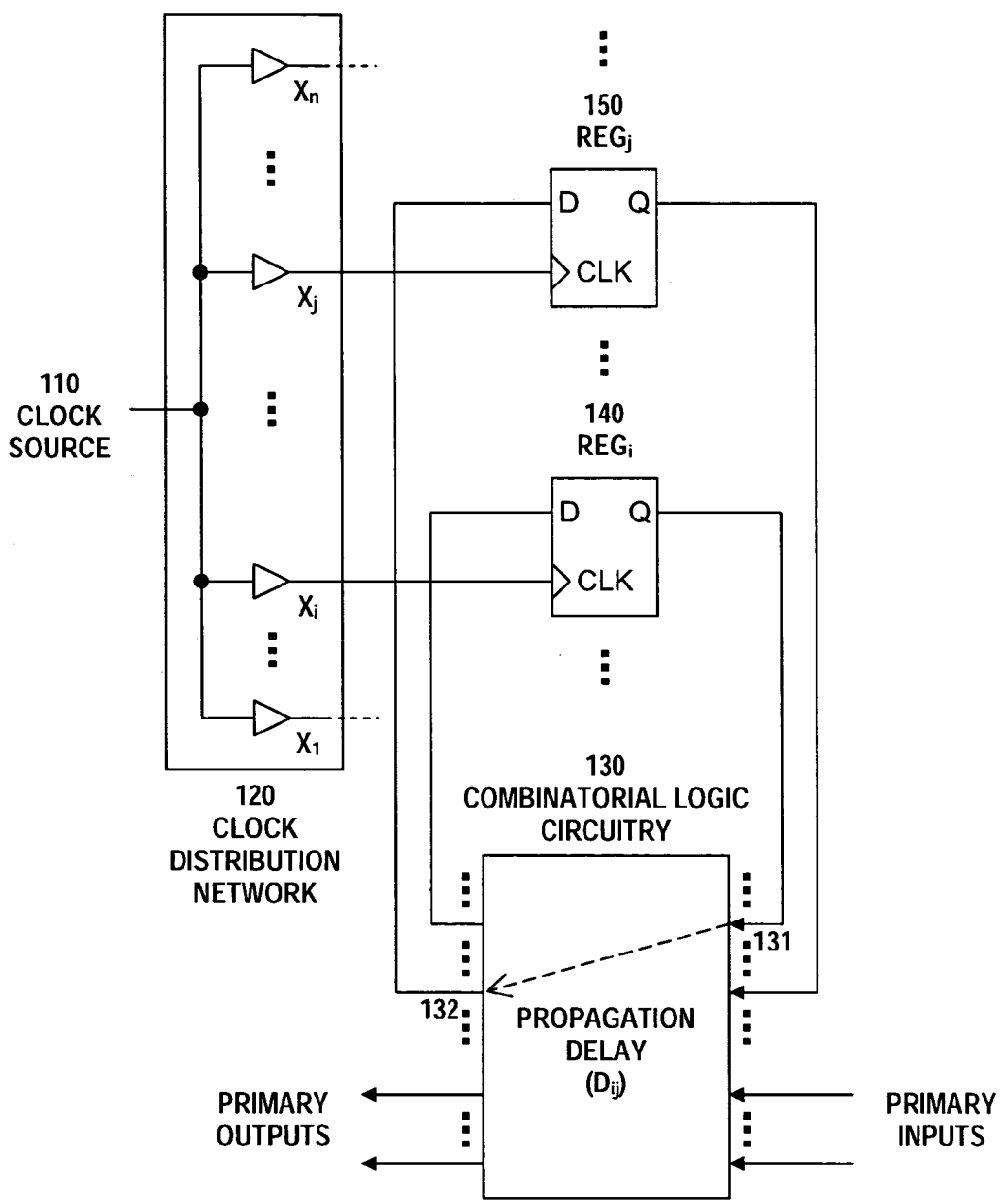
FIG. 1 shows a block diagram of a prior art single-clock synchronous circuit.
Figure 2:
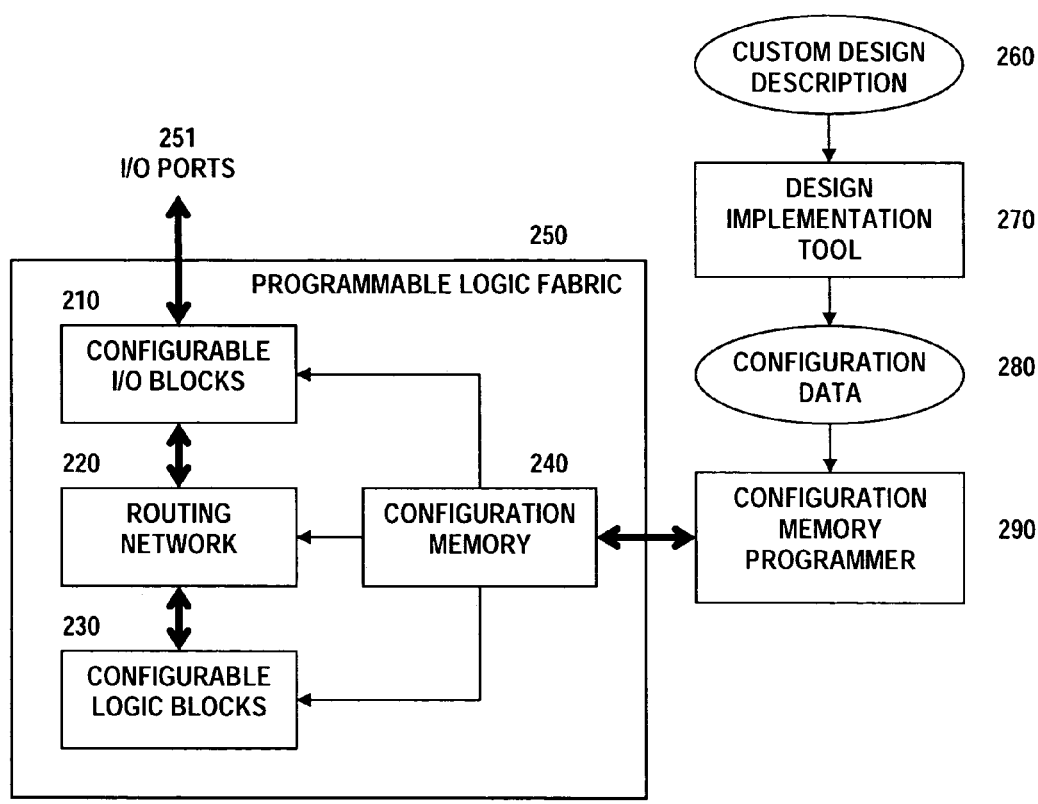
FIG. 2 shows a block diagram for a prior art programmable logic fabric with a flowchart showing the generation of the configuration data.

Once the optimal clock route for each register is selected from the alternative clock routes, then new clock routing path for each register is physically implemented by rerouting the clock signal in accordance with selected optimal clock route. Rerouted clock routes 865 are properly merged with the routed design 815 by the bitstream generator 870 to generate a bitstream file 875 containing a complete configuration data required to program the fabric by the configuration memory programmer 290 as shown in FIG. 2.

The previously described embodiments of the invention are generally applicable to any integrated circuits with dedicated and routing resource for custom circuit implementation such as via-programmable structured ASIC. Also, the described embodiments are intended to be illustrative only, and numerous alternative embodiments within the scope of the appended claims will be apparent to those skilled in the art. For example, clock skew adjustment embodiments in this invention may be used to reduce the peak power consumption or ground bouncing by staggering the clock firing times instead of simultaneous clock firing.

I claim:

1. A programmable logic fabric having:
   a global clock signal coupled to a root node, said root node coupled to a plurality of leaf nodes;
   a plurality of registers, each register having a clock input, a data input, a data output, and other optional ports;
   a routing network having a plurality of inputs and a plurality of outputs, said routing network having a plurality of routes, each route having an input and an output forming a pair, where each said pair has one or more available routes having distinct route delays from said input to said output;

a plurality of clock selection multiplexers for coupling one of said leaf nodes or one of said routing network outputs to at least one of: said register clock input, or said routing network input.

2. The programmable logic fabric of claim 1 where at least one said leaf node is coupled through said clock selection multiplexer to a said routing network input, thereafter from a said routing network output to a different said clock selection multiplexer, thereafter to said register clock input.

3. The programmable logic fabric of claim 1 wherein at least one said leaf node is coupled to a said clock selection multiplexer to a said routing network input, thereafter from a said routing network output to a different said clock selection multiplexer, thereafter to said register clock input, whereby at least one said distinct route delay allows said register to operate at an increased said clock rate.

4. The programmable logic fabric of claim 1 where said global clock signal is coupled to said plurality of leaf nodes through a clock tree.

5. The programmable logic fabric of claim 4 where said clock tree has substantially similar delays from at least one said leaf node to another said leaf node.

6. The programmable logic fabric of claim 1 wherein at least one said register has a logic function coupled to said register input or to said optional port, said logic function operating on at least one of said register outputs or said register inputs.

7. The programmable logic fabric of claim 1 where said plurality of clock selection multiplexers includes at least one multiplexer coupling a clock, in succession, to said routing network, to a different said clock multiplexer, and to a said register clock input.

8. A programmable logic fabric having:
a global clock coupled to a root node, said root node coupled to a plurality of leaf nodes;
a plurality of registers, each register having a clock input, a data input, a data output, and other optional ports;
a routing network having a plurality of inputs and a plurality of outputs, said routing network having a plurality of said routes, each route having an input and an output forming a pair, where each said pair has one or more available routes having distinct route delays from said input to said output;
a plurality of clock selection multiplexers for coupling one of said leaf nodes or one of said routing network outputs to at least one of said register clock inputs;
at least one register multiplexer selecting either said register clock input or one of said register data outputs and coupling said selection to said routing network input.

9. The programmable logic fabric of claim 8 where at least one said leaf node is coupled through said clock selection multiplexer to said register multiplexer and thereafter through said routing network to a different said clock selection multiplexer and to a said register clock input.

10. The programmable logic fabric of claim 8 wherein at least one said leaf node is coupled to a said clock selection multiplexer to a said register multiplexer to a said routing network input, thereafter from a said routing network output to a different said clock selection multiplexer, thereafter to a said register clock input, whereby at least one said distinct route delay allows said register to operate at an increased said clock rate.

11. A process for implementing a logic design in a programmable logic fabric having:
a global clock signal coupled to a root node, said root node coupled to a plurality of leaf nodes;
a plurality of registers, each register having a clock input, a data input, a data output, and other optional ports;
a routing network having a plurality of inputs and a plurality of outputs, said routing network having a plurality of routes, each route having an input and an output forming a pair, where said pair has one or more available routes having distinct route delays from said input to said output;
whereby said clock signal distributed to said leaf nodes can be routed to a plurality of said register clock inputs where each said register clock input can be coupled to said clock leaf node through either:
a direct clock route where said leaf node is coupled to said register clock input without using said routing network;
an indirect clock route where said leaf node is coupled to said register clock input through one of said routes from one of said routing network inputs to one of said routing network outputs;
the process comprising the steps of:
a) implementing a logic design using said registers, said implementation including the steps of synthesizing a design, mapping a design, placing a design, and routing a design;
b) selecting a clock route for each said register clock input from either said direct clock route or said indirect clock routes from one of said clock leaf nodes to said register clock input such that said global clock period of said register may be reduced.

12. The process of claim 11 where selecting a said indirect clock route comprises the steps of:
a) solving the following linear program to compute the required clock delays for each said register clock input:
Minimize P
subject to $X_j - X_i \leq MIN_{ij} - HOLD_j$
$X_j - X_i + P \geq MAX_{ij} + SETUP_j$
for $1 \leq i \leq N$, $1 \leq j \leq N$, where N is the number of said registers clocked by said clock signal, unknown variable P denotes the said clock period, $MIN_{ij}$ and $MAX_{ij}$ correspond to minimum and maximum register-to-register delay from i-th said register ($REG_i$), to j-th said register ($REG_j$), respectively, $HOLD_j$ and $SETUP_j$ correspond to hold and setup time of $REG_j$, respectively, and unknown variables $X_i$ and $X_j$ are said required clock delays for said register clock input of $REG_i$ and $REG_j$, respectively;
b) finding one or more alternative clock routes having distinct route delays for each said register clock input either from said direct clock route or said indirect clock routes such that (i) the difference between each said alternative clock route delay and said required clock delay corresponding to said register clock input is within a pre-specified tolerance, and
(ii) the minimum and maximum delays of said alternative clock routes satisfy following monotone increasing condition:
$MIN_j[1] < MIN_j[2] < \ldots < MIN_j[M_j]$ and $MAX_j[1] < MAX_j[2] < \ldots < MAX_j[M_j]$ for $1 \leq j \leq N$, where $M_j$ corresponds to the pre-specified number of alternative clock routes of j-th register clock input, $MIN_j[k]$ and $MAX_j[k]$ correspond to minimum and maximum route delays of k-th said alternative clock route of j-th register clock input, respectively; and
c) selecting said particular clock route for each said register clock input from an array of alternative clock routes arranged as satisfying a monotonically increasing condition where an index value of said array designating said particular clock route is obtained by solving the following integer monotonic program:

Minimize p subject to $MAX_j[Z_j] - MIN_i[Z_i] \leq MIN_{ij} - HOLD_j$ $MIN_j[Z_j] - MAX_i[Z_i] + P \geq MAX_{ij} + SETUP_j$ for $1 \leq i \leq N$, $1 \leq j \leq N$, where unknown index variables $Z_i$ and $Z_j$ ranged in $\{1, 2, \ldots, M_i\}$ and $\{1, 2, \ldots, M_j\}$, respectively, $M_i$ and $M_j$ are the numbers of said alternative clock routes of i-th said register clock input and j-th said register clock input, respectively.

13. A programmable logic fabric having:
a global clock signal coupled to a root node, said root node coupled to a plurality of leaf nodes;
a plurality of registers, each register having at least a clock input, a data input, and a data output;
a routing network having a plurality of inputs and a plurality of outputs, said routing network having a plurality of routes, each route having an input and an output, said routes having distinct route delays from said input to said output;
a plurality of clock selection multiplexers for coupling one of said leaf nodes or one of said routing network outputs to at least one of: said register clock input, or said routing network input;
whereby said clock signal distributed to said leaf nodes can be routed to a plurality of said register clock inputs where each said register clock input can be coupled to said clock leaf node through either:
a direct clock route where said leaf clock is coupled to said register clock input without using said routing network, or
an indirect clock route where said leaf clock is coupled to said register clock through one of said routes from one of said routing network inputs to one of said routing network outputs, thereafter to a different said clock selection multiplexer to said register clock input.

14. The programmable logic fabric of claim 13 where at least one said indirect clock route allows for a shorter period of said global clock than if said indirect clock route was replaced by a said direct clock route.

15. The programmable logic fabric of claim 13 where at least one said register clock input is directly coupled to a said routing network input.

16. The programmable logic fabric of claim 13 where at least one said routing network input includes a multiplexer for selecting between a said register clock input and a said register data output.

17. The programmable logic fabric of claim 13 where at least one said direct clock route is replaced by a said indirect clock route after the routing of said register data inputs and outputs is completed, thereby providing operation at a shorter said clock period.

18. The programmable logic fabric of claim 17 where said indirect clock routes are selected from unused said routes.

19. The programmable logic fabric of claim 17 where said routing network includes said indirect routes which are selected to reduce a clock period.

20. The programmable logic fabric of claim 13 where said routing network also distributes signals from said register outputs and to said register inputs.

* * * * *